(12) United States Patent
Usoskin et al.

(10) Patent No.: US 8,629,087 B2
(45) Date of Patent: Jan. 14, 2014

(54) HTS COATED CONDUCTOR WITH PARTICLE INCLUSIONS, AND METHOD OF PRODUCTION OF AN HTS COATED CONDUCTOR

(75) Inventors: Alexander Usoskin, Hanau (DE); Klaus Schlenga, Linkenheim (DE)

(73) Assignee: Bruker HTS GmbH, Hanau (DE)

( * ) Notice: Subject to any disclaimer, the term of this patent is extended or adjusted under 35 U.S.C. 154(b) by 0 days.

(21) Appl. No.: 13/137,042

(22) Filed: Jul. 18, 2011

(65) Prior Publication Data
US 2012/0015814 A1    Jan. 19, 2012

(30) Foreign Application Priority Data
Jul. 19, 2010   (EP) .................................... 10170033

(51) Int. Cl.
*H01L 39/24*   (2006.01)

(52) U.S. Cl.
USPC ......................................... 505/474; 505/320

(58) Field of Classification Search
USPC ............ 505/125, 230, 234, 320, 474; 427/62, 427/63, 553, 554, 596
See application file for complete search history.

(56) References Cited

U.S. PATENT DOCUMENTS

| | | | |
|---|---|---|---|
| 3,615,881 A * | 10/1971 | Greene | 148/97 |
| 6,209,190 B1 * | 4/2001 | Chung et al. | 29/599 |
| 6,676,811 B1 * | 1/2004 | Barnes et al. | 204/192.11 |
| 6,830,776 B1 * | 12/2004 | Barnes et al. | 427/63 |
| 7,687,436 B2 * | 3/2010 | Varanasi et al. | 505/325 |
| 7,838,061 B2 * | 11/2010 | Oh et al. | 427/62 |
| 2005/0256011 A1 | 11/2005 | Ignatiev | |
| 2006/0025310 A1 | 2/2006 | Driscoll | |
| 2008/0176749 A1 | 7/2008 | Goyal | |
| 2009/0088325 A1 | 4/2009 | Goyal | |
| 2009/0246530 A1 | 10/2009 | Murakami | |

OTHER PUBLICATIONS

Barnes et al., "In situ creation of nanoparticles from YBCO by pulsed Laser deposition", Physica C, vol. 377, No. 4, Sep. 15, 2002, pp. 578-584.
Misra et al., "Microstructure, flux pinning and critical current density in YbA2Cu3O7-delta films grown by laser ablation", Thin Solid Films, vol. 245, No. 1-2, Jun. 1, 1994, pp. 186-190.

* cited by examiner

*Primary Examiner* — Colleen Dunn
(74) *Attorney, Agent, or Firm* — Paul Vincent

(57) ABSTRACT

A high temperature superconductor (=HTS) coated conductor (1), comprising an HTS layer (11) deposited epitaxially on a substrate (2), wherein the HTS layer (11) exhibits a lattice with a specific crystal axis being oriented perpendicular to the substrate plane (SP), in particular wherein the HTS layer material is of ReBCO type and the c-axis (c) is oriented perpendicular to the substrate plane (SP), wherein the HIS layer (11) comprises particle inclusions (4), in particular wherein the particle inclusions (4) may be used to introduce pinning of magnetic flux, is characterized in that at least a part (4a) of the particle inclusions (4) are formed of the same material as the HTS layer (11), and/or of chemical fractions of the material of the HTS layer (11), such that the average stoichiometry of said part (4a) of the particle inclusions (4) corresponds to the stoichiometry of the HTS layer (11), and that the particle inclusions of said part (4a) are discontinuities of the lattice of the HTS layer (11). A more simple method for producing a HTS coated conductor with reduced losses, and with improved critical current and critical magnetic field is thereby provided.

19 Claims, 4 Drawing Sheets

HTS COATED CONDUCTOR WITH PARTICLE INCLUSIONS, AND METHOD OF PRODUCTION OF AN HTS COATED CONDUCTOR

The application claims Paris Convention priority of EP 10 170033.4 filed Jul. 19, 2010 the complete disclosure of which is hereby incorporated by reference.

BACKGROUND OF THE INVENTION

The invention relates to a high temperature superconductor (=HTS) coated conductor,
comprising an HTS layer deposited epitaxially on a substrate,
wherein the HTS layer exhibits a lattice with a specific crystal axis being oriented perpendicular to the substrate plane,
in particular wherein the HTS layer material is of ReBCO type and the c-axis is oriented perpendicular to the substrate plane,
wherein the HTS layer comprises particle inclusions,
in particular wherein the particle inclusions may be used to introduce pinning of magnetic flux.

Such a method is known from US 2006/0025310 A1.

Superconductors are used to transport electrical current at low resistance, and thus at low power losses. Superconductors require cryogenic cooling in order to ensure the superconducting state. High temperature superconductor (=HTS) materials have a relatively high critical temperature $T_c$, as compared to conventional superconductors, and therefore are less expensive in cooling. In particular, some HTS materials allow the use of liquid nitrogen for cooling. On the other hand, the HTS materials exhibit rather high critical current densities at low temperatures of 3 to 20K. This performance is important for high field magnets used in e.g. NMR where fields are so high that the current performance of low temperature superconductors (typically used in this area) becomes insufficient.

Known HTS materials are ceramic, and may be (and typically are) prepared as thin films on a substrate for practical applications ("coated conductor type"). Generally, in order to achieve a high current carrying capacity, the thin HTS films should be practically single crystalline, with a defect density as small as possible. It is known to use buffer layers between a substrate and a HTS thin film in order to provide the crystalline structure of the thin HTS film, or to improve the crystal quality of the thin HTS film.

However, in the regime of use of HTS materials, the HTS materials act as type II superconductors, meaning that magnetic flux may penetrate into a HTS layer, typically as isolated "flux pipes" (in German "Flussschläuche"). The density and position of the flux pipes depends on the magnetic field present (which may be an external field and/or a field originating from the electrical current running through the HTS layer, "self field"). During use of the HTS coated conductor, the magnetic field typically varies, and the flux pipes redistribute accordingly. This redistribution or movement of the flux pipes causes electrical losses, and may decrease the critical current and the critical magnetic field of the HIS coated conductor at which the HTS material quenches (i.e. becomes normally conducting).

It is known that "pinning centers" may reduce losses and increase the critical current and the critical magnetic field in a type II superconductor. The pinning centers make the flux pipes stay at the pinning centers when the magnetic field varies.

US 2006/0025310 A1 discloses an YBCO film with inclusions of $BaZrO_3$ nanoparticles. The film was prepared by pulsed laser deposition (=PLD) with a target of YBCO with 5 mole % of $BaZrO_3$, and resulted in critical currents $I_c$ improved by a factor of about 1.5 to 2 as compared to pure YBCO films under the same conditions.

US 2008/0176749 A1 and US 2009/0088325 A1 describe YBCO films including vertical columns of nanodots of $BaZrO_3$, deposited by PLD with a single target mixture of YBCO and a nanopowder of $BaZrO_3$. An improvement of the critical current $I_c$ of a factor of 6 was observed.

Although the $BaZrO_3$ particles or nanodots may serve as pinning centers, a co-deposition of YBCO (or another ReBCO) material and an additional inclusion material such as $BaZrO_3$ in the desired way is difficult, and requires specifically prepared targets.

It is the object of present invention to provide a more simple method for producing a HTS coated conductor with reduced losses, and with improved critical current and critical magnetic field.

SUMMARY OF THE INVENTION

This object is achieved, in accordance with the invention, by a method as introduced in the beginning, characterized in that at least a part of the particle inclusions are formed of
the same material as the HTS layer, and/or
of chemical fractions of the material of the HTS layer,
such that the average stoichiometry of said part of the particle inclusions corresponds to the stoichiometry of the HTS layer,
and that the particle inclusions of said part are discontinuities of the lattice of the HTS layer.

According to the invention, particle inclusions are introduced in the HTS layer for the purpose of pinning of the magnetic flux. At least a part of the particle inclusions (i.e. at least a number of all particle inclusions) is made from the same material as the HTS layer or its chemical fractions. A particle inclusion is considered to be made of the chemical fractions of the HTS layer material if the particle inclusion only contains elements present in the HTS layer material, including the case that the particle inclusion has the same stoichiometry as the HTS layer material but is of a different phase, e.g. amorphous or of different crystal structure as compared to the HTS layer crystal structure. The average stoichiometry of all the particle inclusions of said part corresponds to the stoichiometry of the HIS layer (without any particle inclusions). For example, if the HTS layer material (without particle inclusions) is composed as $YBa_2Cu_3O_{6.5}$, then the particle inclusions of said part may be formed, for example, of $Y_2O_3$, BaO, CuO and $YBa_2Cu_3O_{6.5}$, wherein per 0.5 mol of $Y_2O_3$, there are 2 mol of BaO and 3 mol of CuO, and an arbitrary amount (including none) of $YBa_2Cu_3O_{6.5}$.

Every particle inclusion of said part (of all particle inclusions) is formed merely of the HIS layer material and/or its chemical fractions ("derived from the HTS material"); particle inclusions containing elements not present in the HTS layer material (without particle inclusions) may not belong to said part. By means of the invention, material for the HTS layer, which is necessarily provided when depositing a HTS layer, may be used also to generate the at least part of the particle inclusions (and preferably all particle inclusions).

The particle inclusions of said part may easily be co-deposited (concurrently or consecutively) with the HTS layer material, since the material source (e.g. a target for pulsed laser deposition) may be chosen identical for the HTS layer deposition and the particle inclusion deposition. This keeps devices for the preparation of the HTS layer and its inclusions simple, and also may avoid contaminations of the HTS layer (e.g. at changing targets). In order to vary the particle content in the HTS layer, it is enough to alter the deposition conditions then; it is not necessary to provide a different material source (such as a target with a different dopant concentration).

The HTS layer typically comprises numerous grains, which are all oriented with a specific crystal axis perpendicular to the substrate plane (but which may be differently rotated with respect to the specific axis); these grains are also called "in plane of the substrate". As compared to these grains, the particle inclusions of said part are of a different material or of different orientation with respect to the specific axis. The material of a particle inclusion is considered different as compared to the HTS layer material if the stoichiometry is different, or if the stoichiometry is identical but the phase is different (e.g. amorphous in the particle inclusions, but crystalline in the HTS layer).

Preferably, at least some particle inclusions of said part (and possibly all particle inclusions within the HTS layer) are of the same material as the HIS layer. Preferably, the average stoichiometry of all particle inclusions in the HTS layer corresponds to the stoichiometry of the HIS layer, i.e. there are no elements "in excess".

The particle inclusion of said part are typically distributed over the whole volume of the HTS layer. In general, the particle inclusions of said part make between 0.005 vol % and 25 vol % of the HTS layer (including particle inclusions), preferably between 0.01 vol % and 10 vol %. Note that the particle inclusions of said part may be confined to a number of layer structures (or sublayers) within the HIS layer, in this case these layer structures are preferably equally distributed over the whole thickness of the HTS layer.

The substrate on which the HTS layer and the inclusions are deposited may be buffered. Preferably, the substrate is a tape-type steel substrate with a $CeO_2$ buffer. In accordance with the invention, a high temperature superconductor (=HTS) material (in the HTS layer) has a critical temperature $T_c$ of 40 K or higher, preferably 85 K or higher. The HTS layer material is preferably of ReBCO type, with Re: a rare earth element, in particular YBCO (yttrium barium copper oxide).

In a preferred embodiment of the inventive HTS coated conductor, in said part, particle inclusions formed of the same material as the HTS layer are
  single crystalline with an orientation of the specific axis non-perpendicular to the substrate plane, or
  polycrystalline.
By this means, these particle inclusions may provide discontinuities of the epitaxial HIS layer or its grains oriented in plane with the substrate, although having the same elemental composition ("stoichiometry") and the same crystal lattice. It is particularly simple to provide particle inclusions of the same material (or at least the same stoichiometry) as the HTS layer during deposition. Note that particle inclusions of said part may also be amorphous, with a stoichiometry corresponding to the HTS layer material.

In another preferred embodiment, the mean radius of the particle inclusions of said part is between 1 nm and 300 nm, preferably between 1 nm and 15 nm.

The mean radius is the radius of a perfect sphere having a volume corresponding to the average volume of the particle inclusions of said part. In this size regime, good pinning effects are achieved while at the same time not distorting the HTS layer lattice too much. It should be noted that also preferred are sizes (mean radius) of the particle inclusions of said part are between 2 nm and 50 nm, and further between 3 nm and 30 nm.

A preferred embodiment of the inventive HTS coated conductor provides that the mean distance of the particle inclusions of said part is between 5 and 100 times the mean radius of the particle inclusions of said part. This size regime has also led to good pinning effects while at the same time not distorting the HTS layer lattice too much. The mean distance between two particle inclusions is measured between the center of those particle inclusions, and is typically between 5 nm and 300 nm.

Further preferred is an embodiment wherein the material of the HTS layer comprises $ReBa_2Cu_3O_{7-x}$, with Re being Y or another rare earth element. ReBCO material has a high critical temperature, and has been found to be well suitable for pinning with particle inclusions by way of the invention. Note that the HTS layer may contain dopants.

In an advantageous embodiment, the particle inclusions of said part are confined in a number of first sublayers separated by second sublayers not containing particle inclusions of said part. This is easy to prepare; particle inclusions only need to be provided while depositing the first sublayers, and not while depositing the second sublayers. This can be realized by occasionally alternating of the deposition conditions using the same target (having the stoichiometry of the HTS layer material). The second sublayers can also be named HTS sublayers. First and second sublayers alternate along the substrate normal of the HIS coated conductor, typically forming a periodic or quasi-periodic structure. Typically, the second sublayers are much thicker than the first sublayers, such as by a factor of between 3 and 100.

Also within the scope of protection of the present invention is a method for producing a HTS coated conductor, in particular an inventive HTS coated as described above,
  wherein HTS material is deposited on a substrate by pulsed laser deposition, wherein a laser beam is directed onto a target to be ablated, characterized in that a deposition regime regarding
  an energy density per pulse of the laser beam or/and
  a process gas pressure
  is varied during deposition. The inventive method allows to deposit different kinds of material from the same target, making the preparation of inventive HTS coated conductors as described above particularly simple. Thus, the complete HTS layer including any particle inclusions may be prepared with the same (i.e. only one) target. By varying the energy density per pulse and/or the process gas pressure, there is typically switched between two deposition regimes: In a first deposition regime, epitaxial HTS layer material is deposited, with typically no particle inclusions being deposited. In a second deposition regime, particle inclusions are deposited, for example as solid particles colliding with the substrate or the (partially prepared) HTS layer, with no (or only few) epitaxial HTS layer material being deposited. Typically, the deposition regimes are switched between numerous times (such as more than 10 times, or even more than 50 times) during the deposition at the same conductor area segment. Note that more than two deposition regimes may be established, if desired.

In a preferred variant of the inventive method, the deposition regime variation includes several cycles of increasing/decreasing the energy density per pulse of the laser beam or/and the process gas pressure. A cycle includes a sequence of typically several hundreds or even more single pulses in PLD; typically there are numerous cycles (such as more than 10, or even more than 50) for complete deposition of an area segment of a HTS coated conductor. By varying the deposition regime in several cycles, the particle inclusions can be distributed over the thickness of the HTS layer. As far as process gas pressure variation is concerned, it may be either a smooth (or continuous) variation of pressure wherein each cycle is provided within 0.001 to 0.2 of the total deposition time, or a pulsed variation of the process gas pressure with a sequence of pressure pulses.

A preferred further development of this variant provides that the deposition regime variation includes several periodic cycles. Thus an equal distribution of the particle inclusions can be achieved. In an advantageous further development, during a cycle, the energy density per pulse or/and the process gas pressure remains substantially constant for at least 50%, preferably at least 80%, of the cycle. Substantially constant here means a relative change of at maximum 30%, preferably at maximum 20%, further preferably at maximum 10%, most preferred at maximum 5% with respect to the maximum energy density per pulse or maximum process gas pressure during the constant phase of the cycle. Note that the constant phase even may take at least 90% or at least 95% of the cycle. Typically, a low energy density per pulse is applied during the constant phase of the cycle. In the constant phase, high quality epitaxial HIS layer material may be deposited.

In another further development, the deposition regime variation includes cycles of increasing/decreasing the process gas pressure, with a duration of an interval of increased process gas pressure within such a cycle corresponding to between 0.001% and 1% of the entire deposition duration. These time regimes have shown to work particularly well. In practice, a process gas pressure cycle should be no longer than 10 sec, preferably less than 1 sec.

Preferred is also a variant of the inventive method wherein the ratio of the maximum energy density per pulse and the average energy density per pulse used during deposition is between 1.1 and 4, preferably between 1.3 and 2. Said ratios typically apply within each cycle, too. Such variations have shown good results in practice.

Also preferred is a variant wherein the ratio of the maximum process gas pressure and the average process gas pressure used during deposition is between 1.5 and 50, preferably between 1.5 and 6. Such variations have also shown good results. In practice, the change of pressure is typically from about 0.1 mbar to (in maximum) about 2-3 mbar.

In another advantageous variant, the deposition regime variation includes a variation of both the energy density per pulse of the laser beam and the process gas pressure, and that the process gas pressure variation and the energy density variation are synchronized in time. This allows good control over the particle inclusion preparation and deposition, respectively. Note that the two variations may be, but need not be, simultaneous. For example, they may follow one another with some time shift. In particular it is possible to have a number of cycles of one variation, followed by a cycle of the other variation, for example with five cycles of energy density variation per one cycle of process gas pressure variation.

Finally, in a preferred variant, the average stoichiometry of the target used corresponds to the stoichiometry of the HTS material. In other words, the target comprises no excess contents as compared to the basic HTS composition (i.e. the elemental composition of the deposited HTS layer material without any particle inclusions). Thus, the HTS layer can be deposited without difficulty; further, the particle inclusions may be deposited, too, with the same target. Note that the target may be doped, in order to achieve an equally doped HTS layer material.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
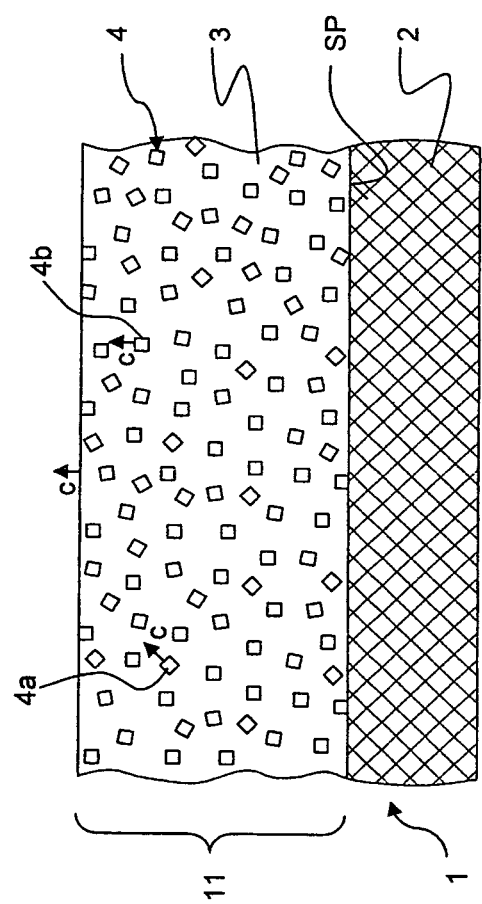
FIG. 1 shows a schematic cross section of a first embodiment of an inventive HTS coated conductor, with randomly distributed particle inclusions.

FIG. 1 shows a schematic, cross-sectional view of a first embodiment of an inventive HTS coated conductor 1, comprising a substrate 2, e.g. of $SrTiO_3$ or of steel tape type. The substrate 1 is typically equipped with a buffer layer, e.g. of $CeO_2$ (not shown, for simplification). On top of the substrate 2 (or its buffer layer, if applicable), there is an epitaxial HTS layer 3, here of YBCO material. The HTS material of the HTS layer 3 is oriented such that the c-axis of the YBCO crystal (or its grains, respectively) is perpendicular to the substrate plane SP (compare the arrow c, on top of the HTS layer 3, indicating the c-axis direction).

Within the HTS layer 3, there are particle inclusions 4, which are here randomly distributed within HIS layer 3. In the example shown, all these particle inclusions 4 are of single crystalline YBCO material, with the same stoichiometry and as the material of the HTS layer 3, and with the same crystal structure. However, the particle inclusions 4 are also randomly oriented. Therefore, most of the particle inclusions 4 have their c-axis not perpendicular to the substrate plane SP, see e.g. particle inclusion 4a, representative of the particle inclusions of this part, and the corresponding arrow c. Only a minority of the particle inclusions 4 happens to be oriented with their c-plane in parallel to the substrate plane SP (i.e. with their c-axis perpendicular to the substrate plane SP), see e.g. particle inclusion 4b, representative for this part, and the corresponding arrow c.

The part 4a of the particle inclusions 4 whose c-plane is not in parallel to the substrate plane SP locally disturb the lattice structure of the HIS layer 3, which effects pinning of magnetic flux in the HTS layer 1.

On top of the HIS layer 11, there may be one or more covering layers, in particular a shunt layer of a noble metal (e.g. gold) (not shown, for simplification).

It should be noted that for another material system, the c-axis may be replaced with another specific crystal axis of the HTS layer material.

In modification of this embodiment, not illustrated in detail, the particle inclusions 4 are made of $Y_2O_3$, BaO and CuO, with a mol ratio of 1:4:6, assuming that the stoichiometry of the HTS layer (without particle inclusions) is of $YBa_2Cu_3O_{6.5}$. Here the deviating material, as compared to the HTS layer material (i.e. $Y_2O_3$, BaO and CuO), disturbs the lattice structure of the HTS layer 3 no matter what the orientation of the particle inclusions is. In this modification, a particle inclusion may contain only one or several of the materials $Y_2O_3$, BaO and CuO. In addition, there may be particle inclusion of amorphous or crystalline $YBa_2Cu_3O_{6.5}$, further particle inclusions containing $Y_2O_3$, BaO and/or CuO may contain amorphous or crystalline $YBa_2Cu_3O_{6.5}$ in addition.

It should be noted that further to the particle inclusions derived from HTS layer material, there may be further particle inclusions not derived from HTS layer material, in particular if the (only) target had additional material different from the intended HTS layer material admixed; in this case the admixed material causes additional particle inclusions in the HTS layer 3. Note that these additional particle inclusions may also contribute to flux pinning, but the volume fraction of these additional particles is fixed by the target (in contrast to the volume fraction of particle inclusions derived from the HTS layer material).

Figure 2:
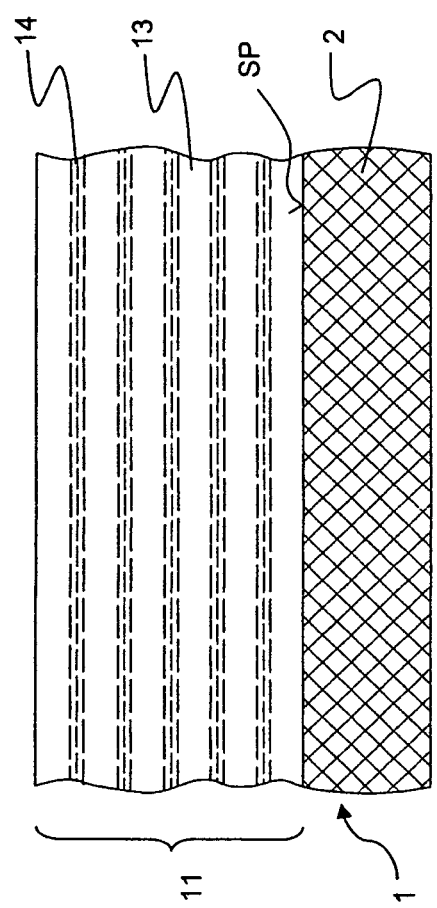
FIG. 2 shows a schematic cross section of a second embodiment of an inventive HTS coated conductor, with particle inclusions confined to sublayers.

FIG. 2 shows a second embodiment of an inventive HTS coated conductor 1. Here a HIS layer 11 based e.g. on YBCO as HTS material, deposited on a (possibly buffered) substrate 2, comprises a number of first sublayers 14 and second sublayers 13. Particle inclusions (not shown in detail) derived from the HTS material are here confined to the first sublayers 14; these first sublayers 14 typically contain, in addition to the particle inclusions, HTS material and/or buffer material, such as $CeO_2$, which is typically used to grow the used HTS material on top of, and/or an amorphous phase (which is not superconducting) of the stoichiometry of the HTS layer material. The first sublayers 14 are separated by the second sublayers 13, which are made of the HTS material and contain no particle inclusions derived from the HTS material (or at least contain much less particle inclusions derived from the HIS material as compared to the first sublayers 14, such as at least ten times less with respect to the volume fraction).

In the example shown, the first sublayers 14 are equally spaced over the thickness (perpendicular to the substrate plane SP) of the HTS layer 11.

Figure 3:
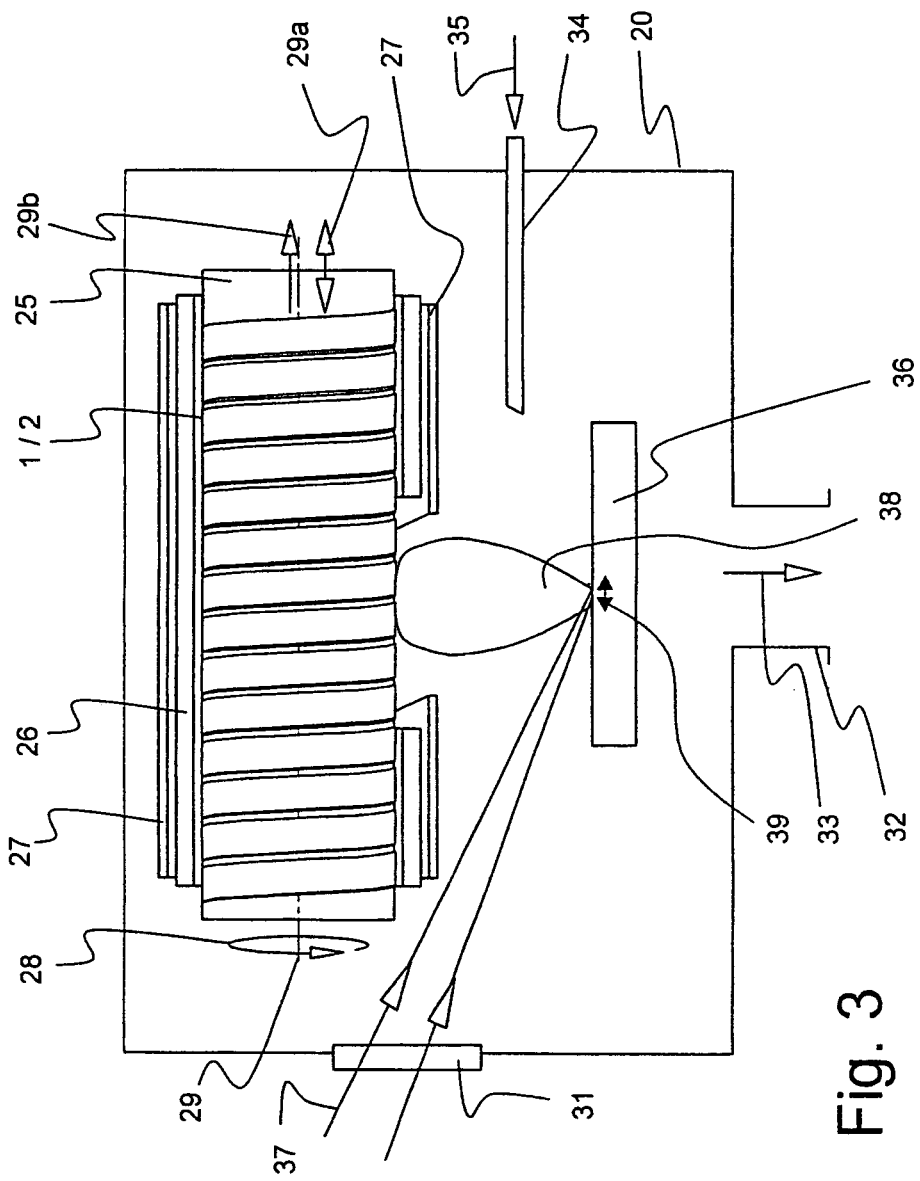
FIG. 3 shows schematically a PLD device for performing the inventive method for producing a HTS coated conductor.

FIG. 3 shows a device or chamber 20 for pulsed laser deposition (PLD) for preparing a HIS coated conductor 1, in particular an inventive HTS coated conductor 1, in accordance with the invention.

The chamber 20 is equipped with an inlet 34 delivering process gas 35 (oxygen in given case) into the processing area, and with a flange 32, attached to a vacuum pump (not shown), evacuating gas 33 out of the chamber 20 such that a desired low pressure (of typically between about 0.1 mbar to 5 mbar) can be maintained.

Within the chamber 20, a tape-type substrate 2, e.g. made of steel and already equipped with a buffer layer, is wound up to a cylinder-shaped holder 25. The holder 25 can both be rotated (see arrow 28 and the axis of rotation 29, which is at the same time the cylinder axis) and moved linearly along the axis 29, see arrow 29a. The holder 25 is positioned within a tubular radiation heater 26, for keeping the HTS coated conductor 1 or its substrate 2 at a desired temperature. A chopper 27, rotating synchronically (to laser beam scans 39, see below) around the heater 26, enables a higher degree of temperature stabilization.

The chamber 20 further comprises a target 36, having the stoichiometry of the intended HTS material for deposition, e.g. $YBa_2Cu_3O_{6.5}$ (note that the exact composition of an YBCO material may vary, in particular with respect to the oxygen content, depending of the desired material properties). Typically, the target 36 is a powder based ceramics or a powder compact containing the polycrystalline HTS material. Through a window 31, the target 36 can be exposed to a laser beam 37. The pulsed energy of the laser beam 37 transferred to the target 36 leads to rapid vaporization of small portions of target material, see plasma cloud (so called plasma plume) 38. The main portion of the evaporated material is deposited on the substrate 2, thus forming the HTS layer of the HTS coated conductor 1. Note that during deposition, the beam spot of the laser beam 37 is moved relative to the target 36, see arrow 39 (by moving the target 36 and/or redirecting the laser beam 37), in order to provide homogenous removal of target material and thus to stabilize a speed of layer deposition.

The deposition process depends on both the intensity of the laser beam 37 and the process gas pressure within the chamber 20. In accordance with the invention, the deposition regime is varied during the production of the HTS layer of the HTS coated conductor 1, in order to be able to deposit both the HTS layer as such and the particle inclusions contained therein. For this purpose, an additional process gas flow (e.g. of oxygen or a mixture of oxygen and argon) can be fed into the chamber 20 through the process gas inlet 34, see arrow 35, thus increasing the process gas pressure within the chamber 20 (the pressure can be decreased by pumping again).

Rotation and, if applicable, back and forth movements of the holder 25 can be used to achieve uniform material deposition on the HTS coated conductor 1.

Note that during the deposition, the holder 25 must also be fed forward, see arrow 29b, in order to achieve material deposition along the complete length of the holder 25 or the complete substrate 2, respectively.

Figure 4:
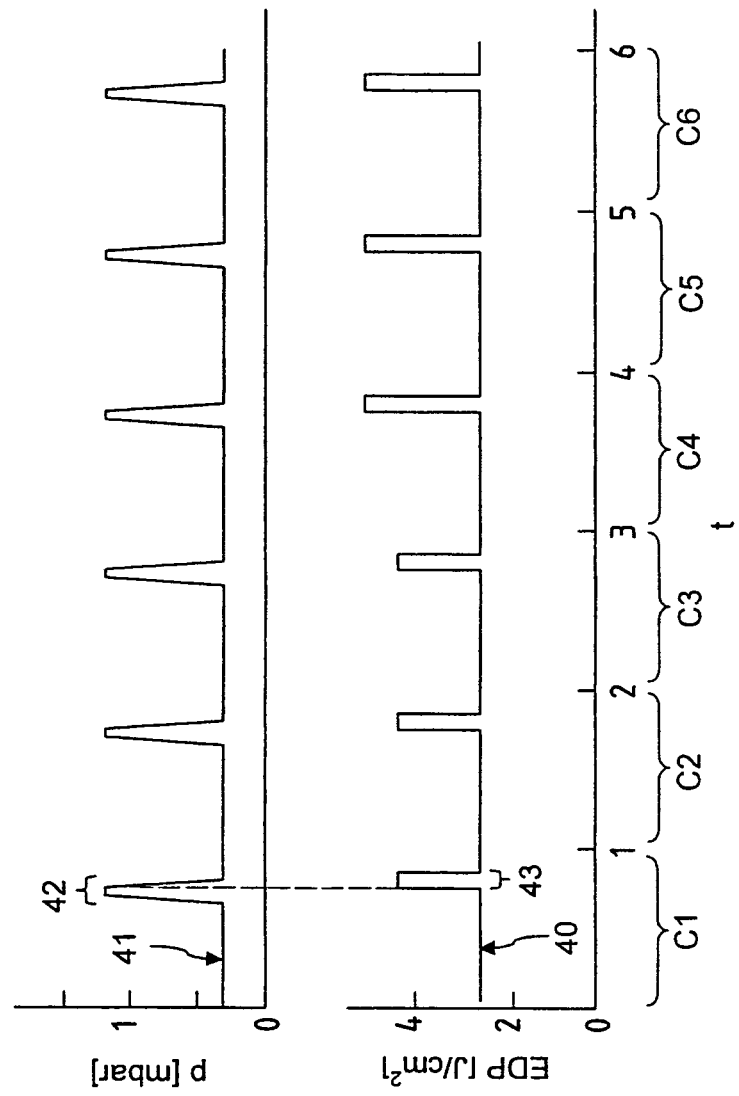
FIG. 4 shows a diagram illustrating the process gas pressure and the energy density per pulse as a function of time during a variant of the inventive method.

FIG. 4 illustrates the variation of the deposition regime in accordance with an inventive method for producing an HTS coated conductor by PLD, which can be performed with a chamber as described in FIG. 3. FIG. 4 shows the process gas pressure p in mbar (top) and the energy density per pulse EDP of a laser beam in $J/cm^2$ (bottom), as a function of time t (in linear scale), noted in the number of completed variation cycles. It should be noted that during a cycle there are typically several hundreds (or even more) short single laser pulses, emitted typically in sequence with a separation of a few ms or faster. Each pulse takes on the order of a few tens of nanoseconds or less.

The variation of the deposition regime (i.e. the process gas pressure p and the energy density per pulse EDP of the laser beam) is done in cycles here all of equal duration. Note that a typical cycle takes about between 1 s and 500 s.

The first cycle C1 starts with an interval 40 of a constant and relatively low energy density per pulse EDP, and an interval 41 of a constant and relatively low process gas pressure p. Shortly before the constant EDP interval 40 ends, the pressure p is increased, see the pressure variation interval 42. When the pressure p is high, EDP is increased, compare energy density per pulse variation interval 43. During interval 43, the pressure p decreases again, i.e.

interval 42 ends. After interval 43 is over, too, the pressure p and EDP are back to their low, constant values. Note that the gas pressure variation interval 42 is typically on the order of 1 s or less. In the example shown, more than 80% of each cycle belong to the constant (low pressure/low EDS) phase, respectively.

During the interval 43, typically large solid particles of HTS material are ejected out of the target, hit the HTS layer surface and keep a basically random orientation there; the deposition regime is optimized for this first purpose then. These particles become particle inclusions after deposition of further HTS layer thickness on top. During the constant intervals 40, 41 typically, HTS material is deposited epitaxially (or almost epitaxially) on the substrate or the HTS layer surface, respectively; again, the deposition regime is optimized for this second purpose then. It should be noted that an alternative mechanism of inclusion formation is based on condensation of plasma/gas flow during adiabatic expansion of the laser plume. The latter mechanism is also well-controlled by gas pressure in combination with variation of EDP.

In the example shown, the first three cycles C1, C2, C3 are identical ("periodic" for three cycles), and the next three cycles C4, C5, C6 are identical ("periodic" for these three cycles). In the latter cycles, the maximum energy density per pulse EDP is higher than in the first three cycles, though. Note that typically further cycles follow (not illustrated here, for simplification of the figures).

In the example shown, the process gas pressure p varies between about 0.35 mbar and 1.2 mbar, with an average process gas pressure (over a cycle) of about 0.4 mbar. Thus the ratio of the maximum and the average process gas pressure p is about 3 here. Further, in the first three cycles, EDP varies between 2.7 J/cm$^2$ and 4.4 J/cm$^2$, with an average energy density per pulse (over a cycle) of about 2.9 J/cm$^2$. Accordingly, the ratio between the maximum and average EDP is about 1.5. In the next three cycles, the EDS varies between 2.7 J/cm$^2$ and 5.1 J/cm$^2$, with an average EDP of about 3 J/cm$^2$. Therefore, the ratio of the maximum and average EDP is about 1.7.

In summary, in accordance with the invention, particle inclusions in a HTS layer of a HTS coated conductor are made from a material source with the same stoichiometry as the HTS material in the HTS layer (without inclusions). Thus, the same material source can be used to prepare both the HTS layer and the inclusions. In the most simple case, the particle inclusions are of the same material as the HTS layer, but have a different orientation and thus disturb the HTS layer lattice, thus allowing flux pinning under the effect of a magnetic field.

Further, the particle inclusions may be formed of chemical fractions of the HTS layer material, with the average stoichiometry of the particle inclusions corresponding to the stoichiometry of the HTS layer. The deviating material may also disturb the HTS layer lattice.

We claim:

1. A method for producing an HTS coated conductor, the method comprising the steps of:
    a) selecting a substrate;
    b) generating a sequence of gas pressure pulses having increased gas pressure;
    c) directing a laser beam onto a target to be ablated, the laser beam comprising a sequence of laser pulses having increased energy density, wherein the gas pressure pulses of step b) and the laser pulses of step c) overlap in time; and
    d) depositing HTS material on the substrate during steps b) and c).

2. The method of claim 1, wherein an HTS layer is deposited epitaxially on said substrate, said HTS layer exhibiting a lattice with a specific crystal axis being oriented perpendicular to a substrate plane, wherein said HTS layer comprises particle inclusions, at least a part of said particle inclusions being formed from chemical fractions of a material of said HTS layer,
    such that an average stoichiometry of said part of said particle inclusions corresponds to a stoichiometry of said HTS layer, said particle inclusions of said part being discontinuities of said lattice of said HTS layer.

3. The method of claim 2, wherein said HTS layer material is of ReBCO type and a c-axis is oriented perpendicular to said substrate plane.

4. The method of claim 1, wherein said particle inclusions introduce pinning of magnetic flux.

5. The method of claim 2, wherein, in said part, said particle inclusions formed of said same material as said HTS layer are single crystalline with an orientation of a specific axis non-perpendicular to said substrate plane or polycrystalline.

6. The method of claim 1, wherein a mean radius of said particle inclusions of said part is between 1 nm and 300 nm.

7. The method of claim 5, wherein a mean radius of said particle inclusions of said part is between 1 nm and 15 nm.

8. The method of claim 2, wherein a mean separation between said particle inclusions of said part is between 5 and 100 times a mean radius of said particle inclusions of said part.

9. The method of claim 1, wherein said material of the HTS layer comprises ReBa$_2$Cu$_3$O$_{7-x}$, with Re being Y or another rare earth element.

10. The method of claim 1, wherein said particle inclusions of said part are confined in a number of first sublayers separated by second sublayers not containing said particle inclusions of said part.

11. The method of claim 1, wherein the deposition regime is varied in several cycles through increasing/decreasing the energy density per pulse of the laser beam and the process gas pressure.

12. The method of claim 11, wherein a deposition regime variation includes several periodic cycles.

13. The method of claim 11, wherein during a cycle, the energy density per pulse or/and the process gas pressure remains substantially constant for at least 50% of the cycle.

14. The method of claim 11, wherein a deposition regime variation includes cycles of increasing/decreasing the process gas pressure, with a duration of an interval of increased process gas pressure within such a cycle corresponding to between 0.001% and 1% of an overall deposition duration.

15. The method of claim 1, wherein a ratio of the maximum energy density per pulse and an average energy density per pulse used during deposition is between 1.1 and 4.

16. The method of claim 1, wherein a ratio of a maximum process gas pressure and an average process gas pressure used during deposition is between 1.5 and 50.

17. The method of claim 1, wherein an average stoichiometry of the target used corresponds to a stoichiometry of the HTS material.

18. The HTS coated conductor of claim 2, wherein the average stoichiometry of all particle inclusions in said HTS layer corresponds to the stoichiometry of said HTS layer.

19. A method for producing an HTS coated conductor, the method comprising the steps of:
    a) selecting a substrate;
    b) generating a sequence of gas pressure pulses having increased gas pressure, wherein each of those gas pressure pulses has a duration of between 0.001% and 1% of an overall deposition duration;
    c) directing a laser beam onto a target to be ablated, the laser beam comprising a sequence of laser pulses having increased energy density, wherein the gas pressure pulses of step b) and the laser pulses of step c) overlap in time; and
    d) depositing HTS material on the substrate during steps b) and c).

* * * * *